(12) United States Patent
Dixon

(10) Patent No.: US 9,000,344 B2
(45) Date of Patent: Apr. 7, 2015

(54) FOCAL PLANE ARRAY PERIPHERY THROUGH-VIAS FOR READ OUT INTEGRATED CIRCUIT

(71) Applicant: Sensors Unlimited, Inc., Princeton, NJ (US)

(72) Inventor: Peter E. Dixon, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 211 days.

(21) Appl. No.: 13/836,872

(22) Filed: Mar. 15, 2013

(65) Prior Publication Data

US 2014/0263954 A1    Sep. 18, 2014

(51) Int. Cl.
*H01L 27/146* (2006.01)

(52) U.S. Cl.
CPC .... *H01L 27/14687* (2013.01); *H01L 27/14618* (2013.01); *H01L 27/14634* (2013.01)

(58) Field of Classification Search
CPC ................. H01L 27/14643; H01L 27/14687
USPC ............................. 250/208.1; 257/290–292
See application file for complete search history.

(56) References Cited

U.S. PATENT DOCUMENTS

| | | | |
|---|---|---|---|
| 7,348,671 B2 | 3/2008 | Kirby | |
| 7,361,989 B1 * | 4/2008 | Adkisson et al. | 257/737 |
| 7,645,701 B2 * | 1/2010 | Anderson et al. | 438/675 |
| 8,232,137 B2 | 7/2012 | Gaul et al. | |
| 2007/0037379 A1 * | 2/2007 | Enquist et al. | 438/618 |

* cited by examiner

*Primary Examiner* — Seung C Sohn
(74) *Attorney, Agent, or Firm* — Cantor Colburn LLP

(57) ABSTRACT

A focal plane array (FPA) including a photodiode array (PDA) and a read out integrated circuit (ROIC). The PDA can include a plurality of conductive through-vias extending through the PDA and electrically isolated from the PDA. The plurality of conductive through-vias can be electrically coupled to circuitry on the ROIC circuit side. The plurality of conductive through-vias can include I/O interconnects such as BGA or other flip-chip bump interconnects that replace conventional wire bond connections, thereby reducing area requirements for bond pads on the ROIC and providing full area coverage of the ROIC circuitry by the PDA bulk material. Embodiments may therefore eliminate wire bonds using bonding to a plurality of metal traces for routing of these interconnects. In an embodiment, an optically transparent lid can include a plurality traces electrically coupled to the plurality of conductive through-vias.

19 Claims, 2 Drawing Sheets

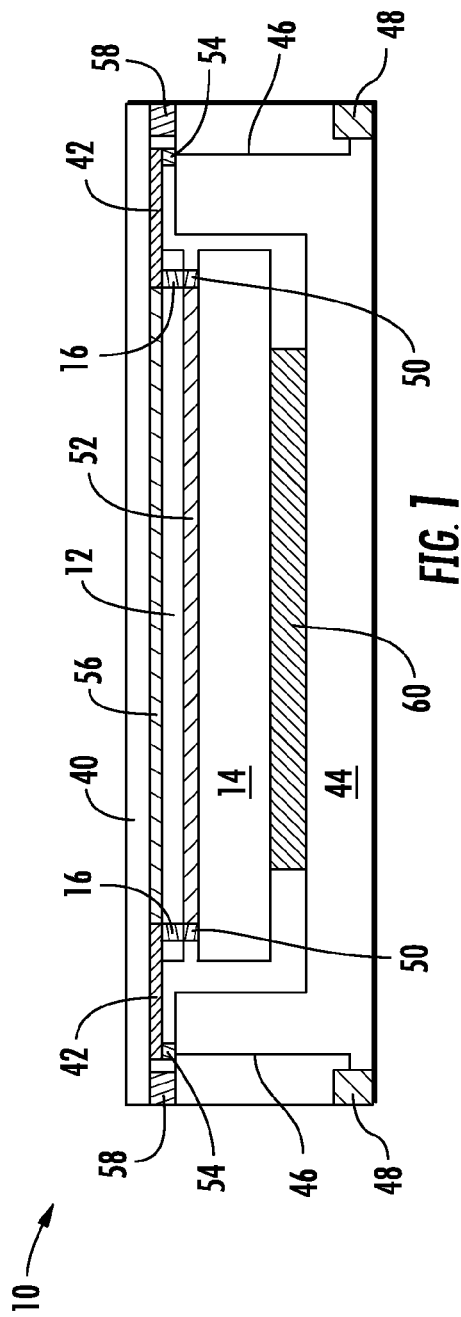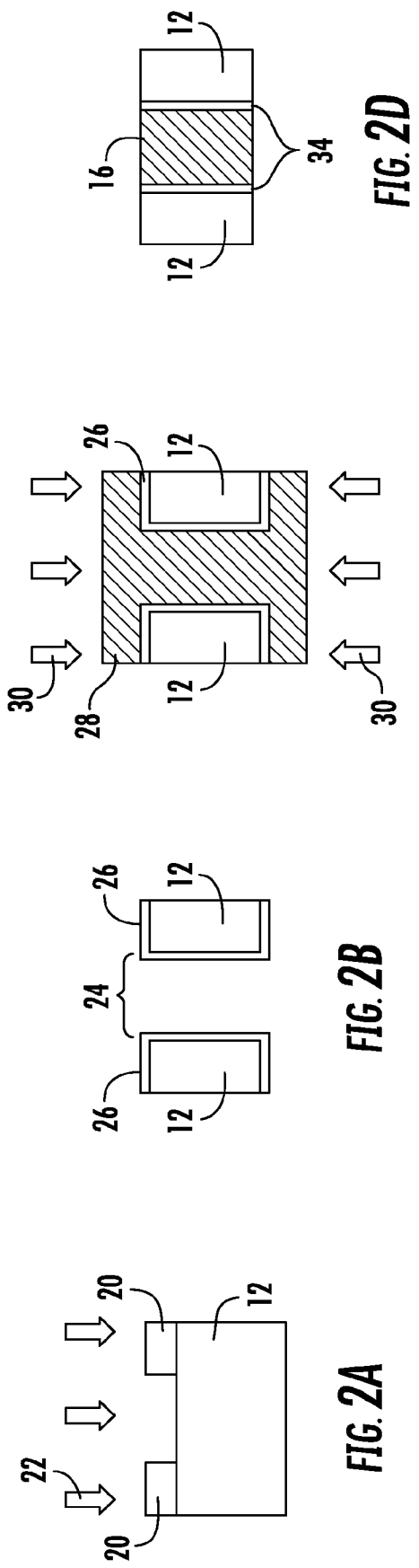

FOCAL PLANE ARRAY PERIPHERY THROUGH-VIAS FOR READ OUT INTEGRATED CIRCUIT

FIELD OF THE EMBODIMENTS

The present teachings relate to the field of integrated circuits and, more particularly, to packaging for a focal plane array device including a photodiode array and a read out integrated circuit.

BACKGROUND OF THE EMBODIMENTS

Light-sensitive image sensors such as focal plane array (FPA) devices include a photodiode array (PDA) packaged with a read out integrated circuit (ROIC). Many different FPA package configurations are available including, for example, leaded and leadless packages. Each conventional package type for FPA can include various shared characteristics.

FIG. 3 depicts a schematic cross-section of an FPA device 200 packaged as a leadless chip carrier (LCC). FIG. 3 includes a ceramic, plastic, or resin carrier body 202 including internal traces 204 electrically coupled to external pads or castellations 206. The external pads 206 can be surface mounted to a circuit board using a conductor, or the device 200 can be placed into an LCC socket. FIG. 3 further depicts a ROIC 208 physically attached to the carrier 202 using an adhesive 210. Bond wires 212 electrically couple bond pads (not individually depicted for simplicity) on the ROIC 208 to the traces 204 within the carrier body 202 such that circuitry on the ROIC 208 can be electrically accessed through the external pads 206. A PDA 214 is mounted to the upper surface of the ROIC 208 using a nonconductive adhesive (not individually depicted for simplicity). A package lid 216 hermetically sealed to the carrier 202 includes a clear window 216A that exposes the PDA 214 to external light. In the device of FIG. 3, the carrier 202 is configured such that the lower surface of the lid 216 does not contact the loop in the bond wires 212. FPAs including ROICs and PDAs provided in different package styles are well known.

Design goals for semiconductor device engineers include providing devices having smaller dimensions, a reduced cost, and improved reliability. A device design that helped to accomplished one or more these goals would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a focal plane array (FPA) can include a read out integrated circuit (ROIC) having a circuit side with circuitry thereon, a photodiode array (PDA) including a plurality of photodiodes, a plurality of conductive through-vias that extend through the PDA, wherein the plurality of conductive through-vias are electrically isolated from the PDA. The FPA can further include a conductor that electrically couples the circuitry on the circuit side of the ROIC to the plurality of conductive through-vias that extend through the PDA.

In another embodiment of the present teachings, method for forming a focal plane array (FPA) can include forming a plurality of conductive through-vias extending through a photodiode array (PDA) which are electrically isolated from the PDA, wherein the PDA comprises a plurality of photodiodes, and electrically coupling circuitry on a circuit side of a read out integrated circuit (ROIC) to the plurality of conductive through-vias that extend through the PDA.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIG. 1 is a cross section of a device according to an embodiment of the present teachings packaged as a leadless chip carrier (LCC);

FIGS. 2A-2D depict various in-process structures that can result from a process for forming conductive through-vias in an embodiment of the present teachings.

Figure 3:
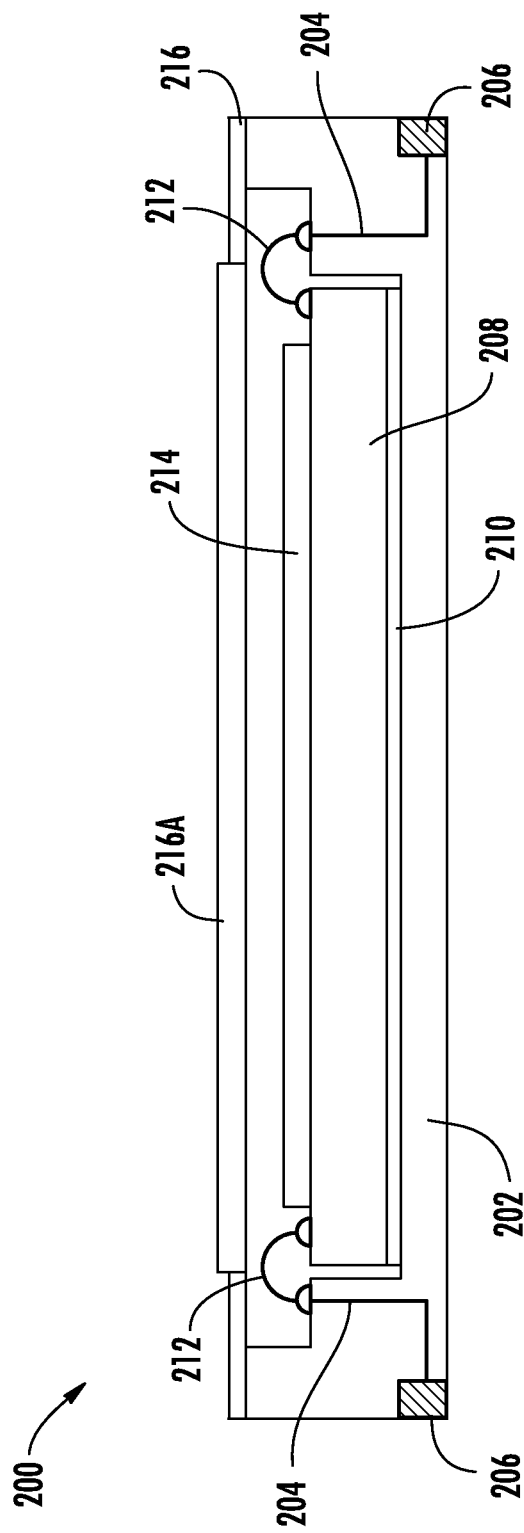
FIG. 3 is a cross section of a conventional device packaged as an LCC.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts.

While embodiments of the present teachings are described with reference to a device packaged as a leadless chip carrier (LCC), it will be understood that a device in accordance with the present teachings can be packaged as a leaded device or as other leadless devices.

Achieving reliable electrical connections within a conventional device package becomes more challenging at decreasing device dimensions. Bond wires 212 such as those depicted in FIG. 3 are relatively large and require correspondingly large bond pads as a bonding surface. For example, conventional read out integrated circuit (ROIC) bond pads for focal plane array (FPA) devices can be about 100 μm by about 160 μm. Additionally, the lower surface of the lid 216 must be above the top of the loop in the bond wire 212 as depicted in FIG. 3, which increases the overall package height. Further, the ROIC must be larger than the photodiode array (PDA) so that bond pads at the periphery of the ROIC are exposed for wire bonding.

An embodiment of the present teachings can result in a more robust electrical connection between circuitry on the ROIC and connections at the exterior of the package compared to bond wires of conventional packages. Further, in an embodiment of the present teachings, the ROIC can be decreased in size to have the same outer dimensions as the PDA, thereby allowing the perimeter dimensions (i.e., footprint) of the package to be smaller. Additionally, the bond wires are eliminated which allows the height of the package to be decreased, for example because the lower surface of the lid can be closer to the PDA than is possible with conventional devices.

FIG. 1 is a schematic cross section depicting an FPA device 10 in accordance with an embodiment of the present teachings, and includes a first semiconductor chip that can be a PDA 12 and a second semiconductor chip that can be a ROIC 14. It will be understood that the PDA 12 and the ROIC 14 can be formed using conventional technology except where indicated. In the embodiment of FIG. 1, the FPA device 10 may not include any wire bonds, particularly wire bonds that provide power and ground for the ROIC, and/or input/output (I/O) signals to and from the ROIC 14.

In the device of FIG. 1, a plurality of conductive through-vias 16 can be formed in the periphery of the PDA 12 during or after the manufacture of the PDA 12 circuitry. In an embodiment, a plurality of through-via openings 16 can be etched entirely through the PDA 12 from back surface to the front surface of the PDA 12, such that each through-via extends through (i.e., completely through) a thickness of the PDA. A plurality of through-via openings 24 (FIG. 2) may be etched at an otherwise unused periphery, which are then filled with a conductor 16.

While various processes for forming the plurality of conductive through-vias 16 are contemplated, one method is depicted in FIGS. 2A-2D. In FIG. 2A, a patterned mask 20, for example photoresist, having a plurality of openings is formed on a surface of the PDA 12 according to known lithographic techniques. Next, a chemical or mechanical etchant 22 appropriate for the material of the PDA 12, which is typically epitaxial silicon, is used to perform a vertical or near-vertical anisotropic etch of the PDA 12 to form through-via openings 24 as depicted in FIG. 2B. In another embodiment, a laser can be used to form the openings 24 by laser ablating the openings 24 through the PDA 12. The openings 24 can be any desired shape such as square, rectangular, circular, or oval, and can have a width, length, and/or diameter of between about 2 µm to about 10 µm, or between about 4 µm and about 6 µm, for example about 5 µm. This is in contrast to conventional bond pads which can be about 100 µm by 160 µm.

Prior to filling the through-via openings 24, sidewalls of the openings 24 may be electrically insulated with a dielectric liner 34 (FIG. 2D) such as silicon dioxide. The conformal dielectric liner can be formed using any known process, such as chemical vapor deposition. The dielectric liner can prevent electrical interference between the though-vias 16 and the PDA 12. In the embodiment of FIG. 2, a conformal dielectric layer 26 may be formed at least within the openings 24 and, in embodiments, over at least one surface or over both the front and back surfaces. Next, a conductor 28 such as a metal is deposited at least within the openings 24 and, in embodiments, over at least one surface or over both the front and back surfaces, of the PDA 12, which may be protected by the conformal dielectric layer 26. Subsequently, the metal 28 is isotropically etched using an etchant 30, such as a wet etch, that is selective to dielectric layer 26, and the dielectric layer 26 is used as an etch stop. Thus once the dielectric layer 26 is exposed during the etch of the conductor 28, the etch is halted. Next, the dielectric layer 26 on the top and bottom surfaces of the PDA 12 is removed, for example using a vertical isotropic etch or a mechanical process such as chemical mechanical planarization (CMP). As depicted in FIG. 2D, this results in a conductive through-via 16 and the dielectric liner 34 that electrically isolates the substrate and circuitry of the PDA 12 from the conductive through-via 16.

In another embodiment, the dielectric liner 34 can be omitted and the peripheral area of the PDA can be doped, either before or after the formation of the conductive through-via 16, to decrease conductivity of the PDA substrate in the region of the conductive through-via 16. In yet another embodiment, the dielectric layer 26 can be left on the front side and the back side of the PDA to function as a passivation layer.

Prior to device assembly, referring back to FIG. 1, a lid (i.e., window) 40 is prepared. The lid 40 can be a material that is optically transparent (which, for purposes of this disclosure, includes optically translucent) to the light wavelength to be detected by the completed FPA 10. In various embodiments, the lid 40 may be glass, a polymer, or a semiconductor material such as silicon, depending on the light wavelength to be detected. To prepare the lid 40, a plurality of conductive patterned traces 42 are formed on the lower surface of the lid 40, where the lower surface is within an interior of the completed FPA 10.

In an embodiment, a blanket conductive layer can be formed on the lower surface of the lid, for example using CVD or a sputtering process, which is then patterned and etched using known lithographic techniques. Using this process, the traces will extend from the lower surface of the lid by a distance equal to the thickness of the traces. In an embodiment, the traces 42 can have a width of between about 2 µm and about 25 µm as needed for proper conductivity or current-resistance requirements. The traces 42 may also have a pitch of between about 10 µm and about 200 µm, offering greater range of capability to manage high interconnect density, thus enabling design freedom previously restricted by bond pad layout. Additionally, the traces 42 can have a thickness of between about 1 µm and about 5 µm, depending upon electrical or mechanical requirements. Forming traces at these dimensions assist in aligning the traces with the conductive through-vias and provide acceptable electrical resistance of the traces.

In another embodiment for forming the traces 42, a plurality of trenches can be chemically or mechanically etched using a lithographic process or laser etched into the lower surface of the lid. A blanket conductive layer can be formed over the lower surface within the trenches, and then a polishing process can be used to remove the blanket conductive layer from the lower surface of the lid 40 except for within the trenches (a process typically referred to as a damascene process). Using this process, the exposed surface of the traces will be co-planar or almost co-planar with the lower surface of the lid, or may be recessed within the trenches.

FIG. 1 further depicts a device package body 44 manufactured according to known techniques. The package body 44 of FIG. 1 is an LCC package, but it will be understood that various embodiments of the present teachings can include a different package body 44 having other leaded or leadless form factors, or a printed circuit board (PCB) or other substrate. The package body 44 can include internal traces 46, each of which may terminate at a first end in a landing pad (not individually depicted for simplicity) internal to the package body 44 and at a second end in a pad or castellation 48 external to the package body 44. In a leaded configuration, the traces 46 will be leads that extend from inside the completed package 10 through the package body 44 to terminate in device leads, such as dual in-line package (DIP) leads, single in-line package (SIP) leads, etc.

After device subassemblies including the PDA 12, the ROIC 14, the lid 40, and the package body 44 have been completed, assembly of the device subassemblies can begin. Conductor 50 can be interposed between the conductive through-vias 16 of the PDA 12 and landing pads (not individually depicted) on the upper surface (e.g., a circuit side) of the ROIC 14. In an embodiment, a conductor 50 such as a flowable metal or a conductive epoxy can be dispensed on either the conductive through-vias 16, the landing pads on the ROIC 14, or on both. The flowable metal of the various embodiments may include ball grid array (BGA) bumps. The conductor 50 is then processed if necessary using a technique appropriate for the conductor 50 to physically and conductively attach the pads on the ROIC 14, which are themselves electrically coupled with circuitry (not individually depicted for simplicity) on the upper surface of the ROIC 14, to the conductive through-vias 16 of the PDA 12. ROIC 14 circuitry is thereby electrically coupled to the conductive through-vias 16 using the conductor 50.

In an embodiment, a dielectric 52 may be used to physically connect the ROIC 14 to the PDA 12. It should be readily apparent to those of ordinary skill in the art that the FPA 10 depicted in FIG. 1 represents a generalized schematic illustration and that other components may added or existing components may be removed or modified.

After electrically coupling the conductive through-vias 16 with the landing pads and circuitry on the circuit side of the ROIC 14, a first end of the conductive through-vias 16 can be electrically coupled to the traces 42 on the lower surface of the lid 40 using any sufficient technique, for example using a metal, conductive epoxy, etc. Subsequently, a second end of the conductive traces 42 on the lid can be electrically coupled to the traces 46 within the package body 44. In an embodiment, a conductor 54 such as a flowable metal or conductive epoxy may be used and cured according to known techniques.

If desired, attachment of the lid 40 to the PDA 12 can further include the use of a dielectric material 56 to attach and secure the lid 40 to the PDA 12. If used, the dielectric material 56 can be optically transparent to the wavelength of light being detected or measured by the PDA 12. The dielectric material 56 can include a polymer, a glass frit material, a thermoplastic, a thermoset, etc., which is deposited and cured according to appropriate techniques.

The conductor 54 electrically couples the traces 42 on the lid 40 to the traces 46 through the package body 44. Physical connection of the lid 40 to the package body 44 can include the use of a hermetic sealing material 58 such as a metal, epoxy, polymer, eutectic, etc.

Thus an electrical path can be established between circuitry on a circuit side of the ROIC 14, through a plurality of circuit landing pads (not individually depicted for simplicity) on the circuit side (upper surface as depicted in FIG. 1) of the ROIC 14, through a plurality of first conductors 50 that electrically couple ROIC 14 landing pads (not individually depicted for simplicity) to the plurality of conductive through-vias 16, to a plurality of second conductors (not individually depicted for simplicity) that electrically couple the plurality of conductive through-vias 16 to the plurality of traces 42 on the surface of the lid 40. The plurality of traces 42 on the lid 40 are electrically coupled to the plurality of package body traces 46 using a third conductor 54. In turn, the plurality of package body traces 46 are electrically coupled to a plurality of pads 48 on an external surface of the package body 44.

In an embodiment, the lower (i.e., noncircuit) surface of the ROIC 14 can be attached to a surface of the package body 44 using a conductive or dielectric attachment material 60, which secures the ROIC 14 in the package body 44 and may give support for other connections such as connections 50 and 54. In another embodiment, structure 60 may schematically represent a thermoelectric cooler (TEC).

Thus the embodiment of FIG. 1 provides an FPA 10 that routes signals from the ROIC 14 circuitry on the interior of the package 10 to pads 48 on an outer surface of the package 10 using no bond wires 212 such as those depicted in FIG. 2. Electrical interconnections on the circuit side of the ROIC 14 can be accessed from the front side of the PDA 12 using the through-vias 16 that extend from the back (noncircuit) side of the PDA 12 to the front (circuit) side of the PDA 16.

In addition, the ROIC 14 can be formed with perimeter dimensions that are the same as, or smaller than, the perimeter dimensions of the PDA 12 (i.e., with the same footprint). In an embodiment, the perimeter dimensions of the ROIC 14 in the X- and Y-directions are the same size, about the same size (allowing for process variability), or smaller than the perimeter dimensions of the PDA 12 in the X- and Y-directions respectively. Because the ROIC 14 can be formed with smaller dimensions than ROICs of conventional devices, the overall dimensions of the FPA 10 may be smaller than conventional devices. Additionally, covering the circuit surface of the ROIC 14 in its entirety with the PDA 12 may provide physical or electrical protection from adverse environmental effects or external radiation.

Additionally, an FPA 10 having a smaller height can be formed, for example because the bottom surface of the lid 40 can be closer to, and even directly attached to, an upper surface of the PDA 12. Further, the plurality of electrical connections within the FPA 10 may be smaller and more reliable than bond wires 212.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A focal plane array (FPA), comprising:
   a read out integrated circuit (ROIC) comprising a circuit side having circuitry thereon;
   a photodiode array (PDA) comprising a plurality of photodiodes;
   a plurality of conductive through-vias that extend through the PDA, wherein the plurality of conductive through-vias are electrically isolated from the PDA; and
   a conductor that electrically couples the circuitry on the circuit side of the ROIC to the plurality of conductive through-vias that extend through the PDA.

2. The focal plane array of claim 1, further comprising:
   a package body;
   an optically transparent lid attached to the package body, wherein the package body and the lid define an interior of the FPA, and wherein the PDA and the ROIC are sealed within the interior of the FPA; and
   a plurality of conductive traces on an interior surface of the lid, wherein the plurality of conductive through-vias are electrically coupled to the plurality of conductive traces on the interior surface of the lid.

3. The focal plane array of claim 2, further comprising a plurality of trenches on the interior surface of the lid, wherein the plurality of traces are within the plurality of trenches.

4. The focal plane array of claim 3, wherein the conductor that electrically couples the circuitry on the circuit side of the ROIC to the plurality of conductive through-vias comprises a flowable metal or a conductive epoxy.

5. The focal plane array of claim 2, further comprising a plurality of traces within the package body, wherein the plurality of traces on the interior surface of the lid are electrically coupled with the plurality of traces within the package body.

6. The focal plane array of claim 2, further comprising a dielectric that physically attaches the PDA to the interior surface of the lid.

7. The focal plane array of claim 2, wherein a perimeter of ROIC in X- and Y-directions is about the same size as a perimeter of the PDA in the X- and Y-directions respectively.

8. The focal plane array of claim 1, wherein circuit side of the ROIC is covered in its entirety by the PDA.

9. The focal plane array of claim 1, further comprising a dielectric liner interposed between the PDA and the conductive through-via that electrically isolates the PDA from the conductive through-via.

10. A method for forming a focal plane array (FPA), comprising:
    forming a plurality of conductive through-vias extending through a photodiode array (PDA) which are electrically isolated from the PDA, wherein the PDA comprises a plurality of photodiodes; and
    electrically coupling circuitry on a circuit side of a read out integrated circuit (ROIC) to the plurality of conductive through-vias that extend through the PDA.

11. The method of claim 10, further comprising:
    attaching an optically transparent lid to a package body, wherein the package body and the lid define an interior of the FPA and the PDA and the ROIC are sealed within the interior of the FPA during the attachment of the optically transparent lid to the package body; and
    electrically coupling a plurality of conductive traces on an interior surface of the lid to the plurality of conductive through-vias.

12. The method of claim 11, further comprising:
    forming a plurality of trenches on the interior surface of the lid;
    forming a blanket metal layer over the interior surface of the lid and within the plurality of trenches on the interior surface of the lid; and
    planarizing the blanket metal layer to form the plurality of conductive traces.

13. The method of claim 12, further comprising electrically coupling the circuitry on the circuit side of the ROIC with the plurality of conductive through-vias using a material selected from the group consisting of a flowable metal and a conductive epoxy.

14. The method of claim 12, further comprising physically attaching the interior surface of the lid to the PDA using a dielectric.

15. The method of claim 12, further comprising:
    providing a PDA having a perimeter in X- and Y-directions; and
    providing a ROIC having a perimeter in X- and Y-directions, wherein the perimeter of the ROIC in the X- and Y-directions is about the same size as the perimeter of the PDA in the X- and Y-directions respectively.

16. The method of claim 11, further comprising electrically coupling a plurality of traces within the package body to the plurality of traces on the interior surface of the lid.

17. The method of claim 10, further comprising covering the circuit side of the ROIC in its entirety by the PDA.

18. The method of claim 10, further comprising:
    forming a plurality of via openings through the PDA from the front side of the PDA to the back side of the PDA;
    forming a conformal dielectric layer on the front side of the PDA, on the back side of the PDA, and on sidewalls of the plurality of via openings;
    forming a blanket metal layer over the front side of the PDA, over the back side of the PDA, within the plurality of via openings, and on the conformal dielectric layer; and
    removing the conductor from over the front side of the PDA and from the back side of the PDA using the conformal dielectric layer as an etch stop.

19. The method of claim 18, further comprising removing the conformal dielectric layer from the front side of the PDA and from the back side of the PDA, wherein the dielectric layer on the sidewalls of the plurality of via openings forms a dielectric liner that electrically isolates the PDA from the conductive through-via.

* * * * *